United States Patent
Wu et al.

(10) Patent No.: US 7,396,767 B2
(45) Date of Patent: Jul. 8, 2008

(54) SEMICONDUCTOR STRUCTURE INCLUDING SILICIDE REGIONS AND METHOD OF MAKING SAME

(75) Inventors: Chii-Ming Wu, Taipei (TW); Cheng-Tung Lin, Jhudong Township, Hsinchu County (TW); Mei-Yun Wang, Hsin-Chu (TW); Chih-Wei Chang, Hsin-Chu (TW); Shau-Lin Shue, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 352 days.

(21) Appl. No.: 10/892,915

(22) Filed: Jul. 16, 2004

(65) Prior Publication Data

US 2006/0011996 A1 Jan. 19, 2006

(51) Int. Cl.
  *H01L 21/44* (2006.01)
(52) U.S. Cl. .................................................... 438/682
(58) Field of Classification Search ................ 438/648, 438/649, 650, 651, 655, 656, 682, 683
  See application file for complete search history.

(56) References Cited

U.S. PATENT DOCUMENTS

| | | | |
|---|---|---|---|
| 4,877,755 A * | 10/1989 | Rodder | 438/586 |
| 5,100,820 A | 3/1992 | Tsubone | |
| 5,624,869 A | 4/1997 | Agnello et al. | |
| 5,645,887 A | 7/1997 | Byun | |
| 5,739,563 A | 4/1998 | Kawakubo et al. | |
| 5,780,362 A | 7/1998 | Wang et al. | |
| 5,780,896 A | 7/1998 | Ono | |
| 5,937,299 A | 8/1999 | Michael et al. | |
| 6,008,124 A | 12/1999 | Sekiguchi et al. | |
| 6,143,617 A | 11/2000 | Shue et al. | |
| 6,159,781 A | 12/2000 | Pan et al. | |
| 6,197,645 B1 | 3/2001 | Michael et al. | |
| 6,201,303 B1 | 3/2001 | Ngo et al. | |
| 6,204,133 B1 | 3/2001 | Yu et al. | |
| 6,204,177 B1 | 3/2001 | Besser et al. | |
| 6,214,680 B1 | 4/2001 | Quek et al. | |
| 6,225,216 B1 | 5/2001 | Ngo et al. | |
| 6,228,761 B1 | 5/2001 | Ngo et al. | |
| 6,232,224 B1 | 5/2001 | Inoue | |

(Continued)

FOREIGN PATENT DOCUMENTS

WO PCT/JP95/00592 3/1995

OTHER PUBLICATIONS

Tavel et al., "Totally Silicided (CoSi2) Polysilicon: a novel approach to very low-resistive gate ( 2 / ) without metal CMP nor etching", 2001 IEEE, pp. 37.5.1-37.5.4.

(Continued)

*Primary Examiner*—Scott B. Geyer
(74) *Attorney, Agent, or Firm*—Duane Morris LLP; Joseph A. Powers

(57) ABSTRACT

A method of forming a silicided gate on a substrate having active regions, comprising the steps of: forming a first silicide in the active regions from a first material; and forming a second silicide in the gate from a second material, wherein the first silicide forms a barrier against the second material forming a silicide in the active regions during the second silicide forming step, wherein said second silicide is thicker than said first silicide.

30 Claims, 3 Drawing Sheets

U.S. PATENT DOCUMENTS

| | | | |
|---|---|---|---|
| 6,235,566 B1 * | 5/2001 | Wu | ............................ 438/199 |
| 6,236,091 B1 | 5/2001 | Ngo et al. | |
| 6,249,010 B1 | 6/2001 | Bergemont et al. | |
| 6,268,257 B1 | 7/2001 | Wieczorek et al. | |
| 6,284,664 B1 | 9/2001 | Kawai | |
| 6,320,213 B1 | 11/2001 | Kirlin et al. | |
| 6,326,270 B1 | 12/2001 | Lee et al. | |
| 6,326,290 B1 | 12/2001 | Chiu | |
| 6,350,636 B1 | 2/2002 | Lee et al. | |
| 6,350,688 B1 | 2/2002 | Liu et al. | |
| 6,351,016 B1 | 2/2002 | Huang et al. | |
| 6,362,023 B1 | 3/2002 | Bergemont | |
| 6,362,086 B2 | 3/2002 | Weimer et al. | |
| 6,376,320 B1 * | 4/2002 | Yu | ............................ 438/303 |
| 6,380,014 B1 | 4/2002 | Ohta et al. | |
| 6,380,578 B1 | 4/2002 | Kunikiyo | |
| 6,444,578 B1 | 9/2002 | Cabral, Jr. et al. | |
| 6,465,309 B1 | 10/2002 | Xiang et al. | |
| 6,475,908 B1 | 11/2002 | Lin et al. | |
| 6,514,859 B1 | 2/2003 | Erhardt et al. | |
| 6,524,916 B1 | 2/2003 | Scholer et al. | |
| 6,562,718 B1 | 5/2003 | Xiang et al. | |
| 6,576,548 B1 | 6/2003 | Tu et al. | |
| 6,602,434 B1 | 8/2003 | Hung et al. | |
| 6,602,781 B1 | 8/2003 | Xiang et al. | |
| 6,630,712 B2 | 10/2003 | Yu | |
| 6,689,688 B2 | 2/2004 | Besser et al. | |
| 6,846,734 B2 | 1/2005 | Amos et al. | |
| 7,045,456 B2 * | 5/2006 | Murto et al. | ................ 438/649 |
| 2002/0019119 A1 | 2/2002 | Saigal et al. | |
| 2002/0064918 A1 | 5/2002 | Lee et al. | |
| 2002/0081794 A1 | 6/2002 | Ito | |
| 2005/0215037 A1 * | 9/2005 | Lu et al. | ..................... 438/583 |

OTHER PUBLICATIONS

Polishchuk et al., "Dual Work Function Metal Gate CMOS Technology Using Metal Interdiffusion", 2001 IEEE, pp. 444-446.

Lu et al., "Metal Gate Work Function Adjustment for Future CMOS Technology", 2001 Symposium on VLSI Technology digest of Technical Papers, pp. 45-46.

Yeo et al., "Effects of High-k Dielectrics on the Workfunctions of Metal and Silicon Gates", 2001 Symposium on VLSI Technology Digest of Technical Papers, pp. 49-50.

Matsuo et al., "Damascene Metal Gate MOSFETs with Co Silicided Source/Drain and High-k Gate Dielectrics," 2000 Symposium on VLSI Technology Digest of Technical Papers, pp. 70-71.

Krivokapic et al., "Nickel Silicide Metal Gate FDSOI Devices with Improved Gate Oxide Leakage", 2002 IEEE, pp. 271-273.

Lee et al., "Tunable Work Function Dual Metal Gate Technology for Bulk and Non-Bulk CMOS", 2002 IEEE, pp. 359-362.

Choi et al., "FinFET Process Refinements for Improved Mobility and Gate Work Function Engineering", 2002 IEEE, pp. 259-262.

Ranade et al., "Tunable Work Function Molybdenum Gate Technology for FDSOI-CMOS", 2002 IEEE, pp. 363-366.

* cited by examiner

SEMICONDUCTOR STRUCTURE INCLUDING SILICIDE REGIONS AND METHOD OF MAKING SAME

FIELD OF THE INVENTION

The present invention relates to semiconductor fabrication and more particularly to methods of forming field effect transistors having silicided regions.

BACKGROUND OF THE INVENTION

The principle way of reducing contact resistance between polysilicon gates and source/drain regions and interconnect lines is by forming a metal silicide atop the source/drain regions and the gate electrodes prior to application of the conductive film for formation of the various conductive interconnect lines. Presently, the most common metal silicide materials are $CoSi_2$ and $TiSi_2$, typically formed by the so called salicide (self-aligned silicide) process. In the salicide process, a thin layer of a metal, such as titanium, is blanket deposited over the semiconductor substrate, specifically over exposed source/drain and gate electrode regions. The wafer is then subjected to one or more annealing steps, for example at a temperature of 800° C. or higher for titanium. This annealing process causes the metal to selectively react with the exposed silicon of the source/drain regions and the gate electrodes, thereby forming a metal silicide (e.g., $TiSi_2$). The process is referred to as the self-aligned silicide process because the silicide layer is formed only where the metal material directly contacts the silicon source/drain regions and the polycrystalline silicon (polysilicon) gate electrode. Following the formation of the silicide layer, the unreacted metal is removed and an interconnect process is performed to provide conductive paths, such as by forming via holes through a deposited interlayer dielectric and filling the via holes with a conductive material, e.g., tungsten.

The thickness of the silicide layer is an important parameter because a thin silicide layer is more resistive than a thicker silicide layer of the same material. Therefore, a thicker silicide layer increases semiconductor speed. The formation of a thick silicide layer, however, may cause a high junction leakage current and low reliability, particularly when forming ultra-shallow junctions. The formation of a thick silicide layer consumes silicon from the underlying semiconductor substrate such that the thick silicide layer approaches and even shorts the ultra-shallow junction, thereby generating a high junction leakage current.

It is desirable to also lower the resistance of the gate electrode to increase the speed of the device. The greater the amount of silicon converted into silicide in the gate electrode, the lower the resistance will be in the gate electrode. However, formation of silicide on the gate electrode simultaneously with the source/drain regions leads to the risk of spiking in the source/drain regions if the complete or nearly complete silicidation of the gate electrode is attempted. This process, therefore, suffers from a very narrow process window due to the strong likelihood that exposure of the metal and silicon to rapid thermal annealing conditions sufficient to completely silicidize a gate electrode will also cause the silicide in the source/drain region to spike and reach the bottom of the junction, undesirably causing leakage.

U.S. Pat. Nos. 6,562,718 and 6,602,781 to Xiang et al. describe methods of forming a fully or nearly fully silicided gate electrodes. However, there remains a need for simplified processes for forming different silicide structures within the source/drain and gate electrode regions that better incorporate standard integrated circuit fabrication process flow and structure, while improving the processing window.

SUMMARY OF THE INVENTION

A method of forming a silicided gate on a substrate having active regions, comprising the steps of: forming a first silicide in the active regions from a first material; and forming a second silicide in the gate from a second material, wherein the first silicide forms a barrier against the second material forming a silicide in the active regions during the second silicide forming step, wherein said second silicide is thicker than said first silicide.

An integrated circuit is also provided comprising a substrate having active regions formed therein and a gate structure formed thereon, wherein the active regions have a first silicide formed therein at a first annealing temperature, and the gate has a second silicide formed therein at a second annealing temperature less than or equal to said first annealing temperature, wherein the second silicide is thicker than said first silicide.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

The method steps described below do not form a complete process flow for manufacturing integrated circuits. The present embodiments can be practiced in conjunction with integrated circuit fabrication techniques currently used in the art, and only so much of the commonly practiced process steps are included as are necessary for an understanding of the described embodiments. The figures represent cross-section portions of a semiconductor chip or a substrate during fabrication and are not drawn to scale, but instead are drawn to illustrate the features of the described embodiments.

Figure 1:
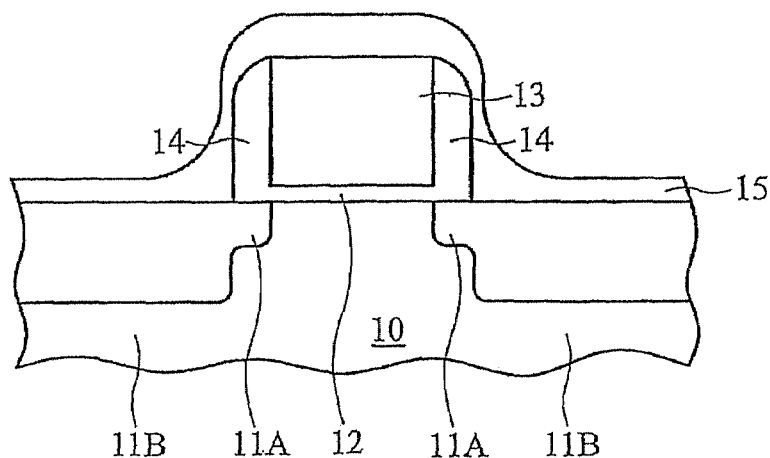
FIGS. 1-7 schematically illustrate sequential steps for forming a fully silicided gate in accordance with an embodiment of the present invention.

Sequential steps of an exemplary embodiment of the method of forming silicide regions in a semiconductor substrate are described below with respect to the schematic illustrations of FIGS. 1-7. Similar reference numerals denote similar features. Referring first to FIG. 1, a conventional transistor structure is shown comprising a substrate 10 doped with either an N-type impurity or P-type impurity, and source/drain regions 11 comprising shallow extension regions 11A and heavily doped regions 11B doped with either a P-type impurity or an N-type impurity. In an exemplary embodiment, the substrate comprises crystalline silicon, e.g., monocrystalline silicon. The substrate 10 may also be, for example, a silicon-germanium substrate, III-V compound substrate, silicon-on-insulator (SOI) substrate, or other substrate such as utilized in FinFET, raised source/drain and strained silicon structures. As is common, the source/drain regions 11 have a conductivity opposite to that of the substrate. The source/drain regions 11 are formed by first forming polysilicon gate electrode 13 on the substrate 10 with gate dielectric layer 12, e.g., a gate oxide such as silicon dioxide or a high-K dielectric material, therebetween. In some embodiments, gate electrode 13 may comprise amorphous silicon or silicon germanium. In one embodiment, gate electrode 13 has a height between about 500-2000 Å. Using the gate electrode 13 as a mask, shallow extension regions 11A are formed. Dielectric sidewall spacers 14 are then formed on the side surfaces of the gate electrode 13. Dielectric sidewall spacers 14 may comprise any suitable dielectric material, such as silicon dioxide, silicon nitride, or a composite of silicon dioxide and silicon nitride. Ion implantation is then conducted, using the gate electrode 13 and sidewall spacers 14 as a mask to form heavily doped regions 11B.

Figure 2:
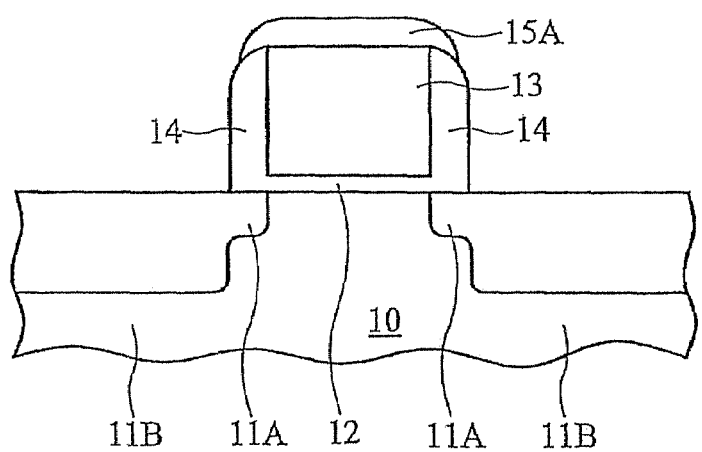

In an exemplary embodiment, a shielding layer 15 is formed, such as by a chemical vapor deposition process or a furnace process, over the substrate and etched, as shown in FIG. 2, to expose the active regions 11 while the remaining portion 15A covers the gate 13. In one embodiment, shielding layer 15 comprises $SiO_2$, SiN, SiON, SiC, SiCN or some other material that will not react with the subsequently deposited metal layer. In one embodiment, layer 15 is formed to a thickness between about 30-500 Å, and more preferably between about 100-200 Å. Layer 15 may be etched using a dry etch process. In one embodiment, the layer 15 comprises $SiO_2$, and a $CxFy+O_2/CO/N_2/H_2/Ar$(or He) gas may be used as an etchant. If the layer 15 is SiON or SiN, a $CxHyFz/CF_4 + O_2/Ar/N_2$ etchant may be used, in one embodiment.

Figure 3:
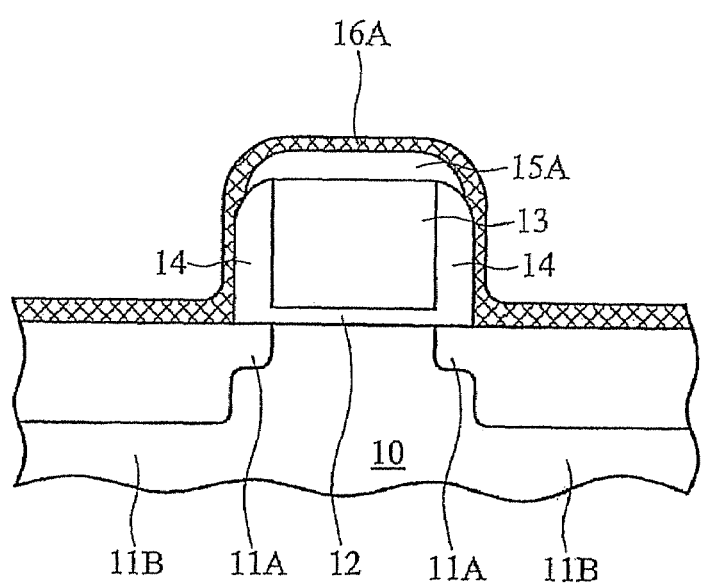

As shown in FIG. 3, a layer 16, which may comprise a pure metal, a metal alloy or a metal with additives (e.g., C, Al, Sc, Ti, V, Cr, Mn, Fe, Cu, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb, Lu and mixtures thereof) that improve or change the thermal stability and/or salicide formation temperature is blanket deposited over the substrate. An additional cap layer (not shown) may also be deposited over the layer 16, such as a layer of Ti or TiN, to provide moisture protection (i.e., TiN) or help the interface reaction (i.e., Ti). In an exemplary embodiment, layer 16 comprises cobalt, which has a relatively high phase transformation temperature to $CoSi_2$ greater than 650° C. Briefly, the silicide process is a phase transformation process. If the processing temperature is greater than the phase transformation temperature of a material, the original material phase will change to another phase. Different phases have different atomic arrangement and properties. For example nickel's first phase transformation temperature is about 250° C. At a temperature above 250° C., nickel will react with silicon to form NiSi. However, another phase transformation temperature for nickel is about 700° C. At a processing temperature above 700° C., NiSi will change to $NiSi_2$. Any temperature between about 250° C. and 700° C. could be the rapid thermal anneal (RTA) temperature to form NiSi. Usually, $CoSi_2$ uses a two-step rapid thermal anneal (RTA) process. The first RTA temperature range is from about 300 to about 650° C., preferably about 400 to 550° C., to form $Co_2Si$ or CoSi. The second RTA temperature is greater than about 650° C. to form $CoSi_2$. $CoSi_2$ is the final, preferred phase. There is a selective etch process between the first RTA and the second RTA to prevent the bridging effect on oxide layer (i.e. spacer STI (shallow trench insulator)). In general, $CoSi_2$ and NiSi are the preferred phases of cobalt and nickel silicide, respectively, because these two silicides have lower resistivity than alternative cobalt and nickel silicides.

Referring again to FIG. 3, the metal layer 16 is also deposited over the remaining portions of the shielding layer 15A, which protects gate 13 from reacting with metal layer 16 during subsequent processing. The metal layer 16 can be deposited in any manner, such as by chemical vapor deposition (CVD), by sputtering, by atomic layer deposition (ATD) or by thermal evaporation. In one embodiment, layer 16 is deposited to a thickness between about 20-300 Å, and more preferably between about 50-120 Å.

Figure 4:
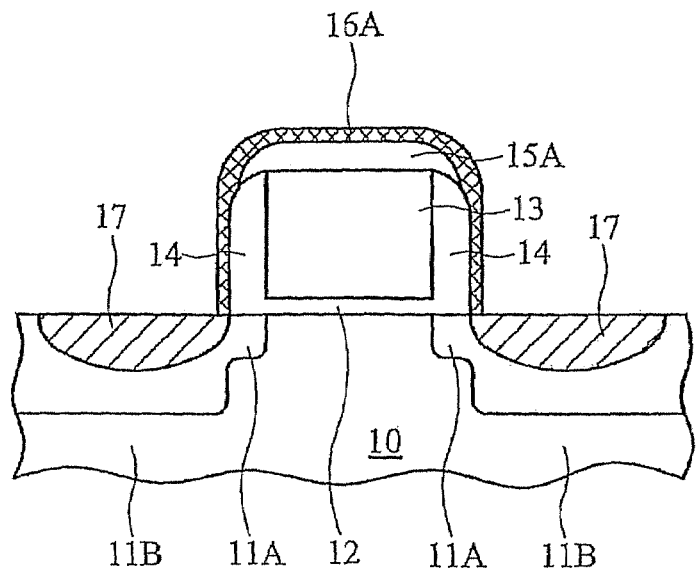

Referring to FIG. 4, an annealing step, preferably a rapid thermal annealing step or steps, is performed to react metal 16 with the exposed active regions 11 to form silicide regions 17 therein. The annealing temperature and time are selected dependent upon the metal selected and the desired depth of the silicide layer 17 formed thereby. In one embodiment wherein layer 16 comprises Cobalt, the annealing process includes two rapid thermal anneals. A first anneal is performed at between about 400-550° C. for 10-120 seconds to form $Co_2Si$ or CoSi, or a mix of these two phases. Any unreacted metal 16A (FIG. 4) is removed from the substrate 10, leaving remaining portion of shielding layer 15A, which is then removed prior to deposition of a second metal layer 18 as described below. The unreacted metal layer 16A may be removed by a wet chemical etch, for example, or other process. In an exemplary embodiment, the unreacted metal is removed using an $HNO_3$, HCl, $NH_4OH$, $H_2SO_4$, $H_2SO_2$ or other acid etchant or mix.

A second, subsequent anneal is then performed at a higher temperature at between about 650-900° C., more preferably 700-900° C., for about 10-120 seconds. Upon annealing, a low resistivity metal silicide 17, e.g., $CoSi_2$, is formed in the active regions 11, while the gate 13 remains unsilicided. The silicide is preferably formed to a depth between about 50-500 Å. The thickness of silicide layer 17 can be tailored or optimized by controlling the thickness of the deposited metal layer 16 and the rapid thermal annealing process parameters, e.g., annealing time and temperature.

After formation of metal silicide 17 and removal of unreacted metal 16A, layer 15A is removed to expose the top surface of the gate 13. If shielding layer 15A comprises SiN or SiON, the layer 15A may be removed using an etchant solution comprising phosphoric acid, e.g., a $H_3PO_4$ (75-95%) solution at a temperature of about 100-200° C. In one embodiment, layer 15A comprises $SiO_2$ and the substrate is dipped in a 1:1-1000:1 ($HF/H_2O$ ratio) HF solution to remove the $SiO_2$ layer.

Figure 5:
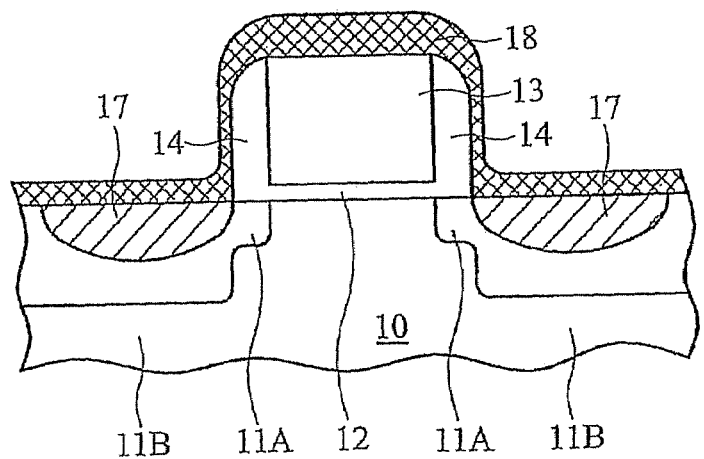
Figure 6:
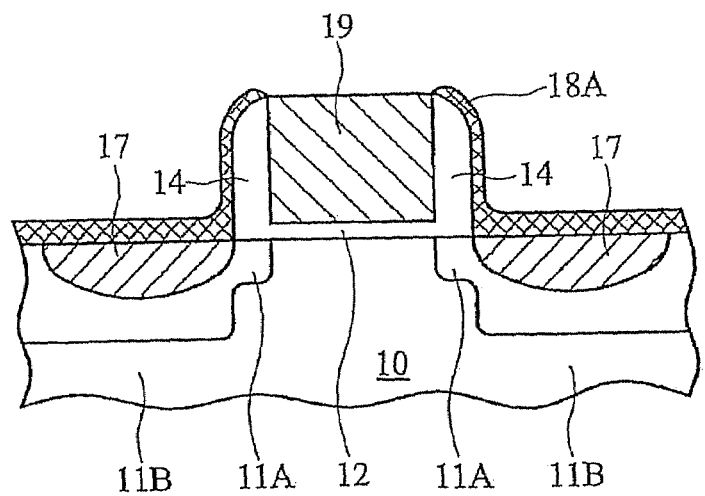

As shown in FIG. 5, a second metal layer 18 is then deposited over the substrate, including over exposed gate electrode 13. Layer 18 preferably comprises a metal that can be processed to phase transform to a desired low resistivity phase at a temperature equal to or lower than first metal layer 16. In one embodiment, layer 18 comprises Nickel, which phase transforms to low resistivity NiSi at a temperature of about 250° C. In one embodiment, layer 18 is preferably deposited to a thickness sufficient to form a silicide in gate 13 that is thicker than silicides 17 in the active regions, and in one embodiment to fully silicide gate 13 upon processing thereof, although (as noted) partial silicidation is also contemplated. After layer 18 is deposited, an annealing step is performed at a temperature greater than the desired phase transformation temperature of metal 18 but less than the transformation temperature used to process the first metal layer 16 (e.g., the higher, second annealing temperature used in the $CoSi_2$ formation process) and less than the temperature at which the nickel/silicon form higher resistivity $NiSi_2$, thereby producing silicided gate 19 (FIG. 6) comprising NiSi. In one embodiment, the annealing takes place at a temperature between about 250° C. to 700° C. for about 20 to about 1000 seconds, more preferably between about 250-500° C. to avoid formation of $NiSi_2$, which has a higher resistance than NiSi, and to avoid excess thermal stresses and thermal shocks associated with higher temperatures. The first formed silicide regions 17 serve as a barrier layer to block the atom diffusion of layer 18 through the first formed silicide as long as the annealing temperature and time are controlled. Processing the second metal layer 18 at a lower (or even equal) rapid thermal anneal temperature, and optionally time, than the first formed silicide layer 17 can provide better control for this process. In one embodiment, the second annealing process is for a time of less than 1000 seconds. As described above for layer 16, the layer 18 may also have a cap layer, such as Ti or TiN (Ti to help silicide formation and TiN for moisture prevention). Other cap layers may also be utilized, although Ti and TiN are the most common.

Although the process has been described as providing $CoSi_2$ and NiSi silicide regions in active regions 11 and gate electrode 13, respectively, other possibilities are contemplated, such as different combinations of Cobalt, Nickel, Tungsten, Titanium, Molybdenum or other materials. The first silicide and second silicide could also be the same material, like NiSi, or even different phases of the same silicide, such as $NiSi_2$ and NiSi, respectively. For example, NiSi could first be formed in the source/drain region at a rapid thermal anneal temperature of about 500° C. The second formed NiSi in the gate electrode can then be formed at temperature equal to or lower than the first rapid thermal anneal temperature, e.g., at about 400° C., and optionally for a shorter period of time. Using a lower (or equal) temperature for the second silicidation process prevents the second metal layer 18 from diffusing through the first formed silicide and allows for better control of the gate silicidation without shorting the shallow junctions of the active regions.

Because the second metal layer 18 is processed at an equal or lower phase transformation temperature than the first metal layer 16 that forms silicides 17, a processing temperature can be used in the second anneal that does not promote any further silicide formation in already silicided regions 17. Limiting unwanted silicide growth in the active regions prevents junction leakage and bridging, i.e., current leakage from active region to active region or gate to source/drain region, and substantially widens the processing window for forming a partially or fully silicided gate 19, which has a silicide thickness greater than the thickness of the active region silicide, because gate 13 can be partially or fully silicided without concerns for over-siliciding the active regions. By "fully silicidize" or "fully silicided" it is meant that the gate electrode is substantially silicided, meaning, in one embodiment, silicide forms in at least 90-100 percent of the gate height, and more preferably at least 95-100 percent of the height of the gate. The process described herein, however, is not limited to producing fully silicided gates. Rather, the process can be used to provide partial silicidation of the gate electrode, thereby increasing the silicide thickness at gate area to reduce the gate resistance and increase device speed.

Figure 7:
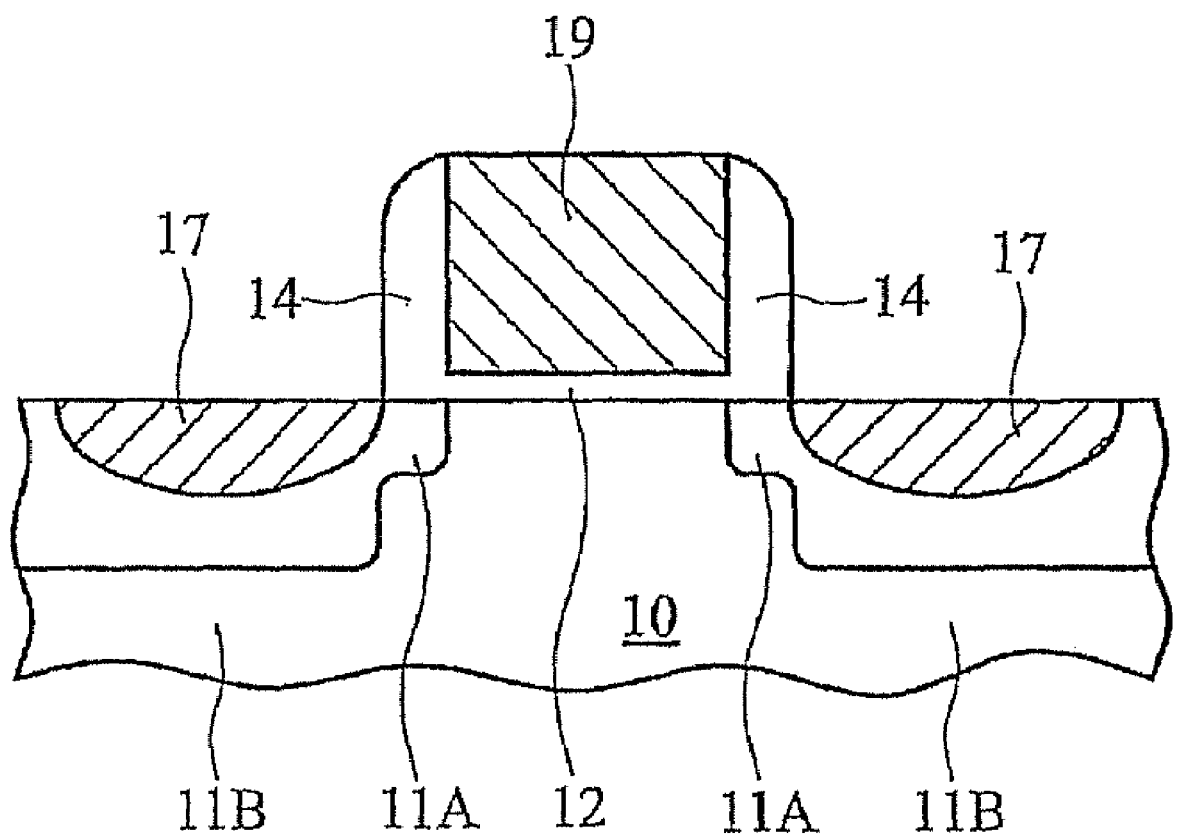

Referring now to FIG. 7, the unreacted portions 18A (FIG. 6) of the second metal layer 18 are removed, such as by a wet chemical etch that is highly selective to the unreacted metal layer 18 relative to the silicides. In an exemplary embodiment, the unreacted metal 18A is removed using an $HNO_3$, HCl, $NH_4OH$, $H_2SO_4$ or other acid etchant. Subsequent processing steps familiar to those in art are then performed, such as to provide metallization layers that connect the devices formed in substrate 10.

The manufacturing process described herein is adaptable to manufacturing any of the various types of semiconductor devices, particularly advanced deep-submicron CMOS devices, such as 0.1 micron devices with ultra-shallow junctions, e.g., above 500 Å to about 2000 Å, while significantly improving the reliability of ultra-shallow junctions. Reduction of parasitic, sheet and contact resistance between the active regions and the gate electrode and interconnects may be achieved without increasing junction leakage current. Greater control of the silicidation process is provided in forming fully or partially silicided gate electrode 19 and silicided active regions 17, without compromising the reliability of the active regions. Therefore, improved fully silicided gates may be achieved along with consequent benefits thereof, such as lower gate electrode resistance, improved device speed, prevention or reduction of boron migration into the gate electrode and reduction or elimination of the depletion effect, without high junction leakage current or spiking.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of forming a silicided gate on a substrate having active regions, comprising the steps of:
   forming a first silicide in the active regions from a first material; and
   forming a second silicide in the gate from a second material, wherein said second material is deposited over said substrate and in contact with said gate and said first silicide, wherein said first silicide forms a barrier against said second material forming a silicide in said active regions during said second silicide forming step,
   wherein said second silicide is thicker than said first silicide.

2. The method of claim 1,
   wherein said first forming step comprises:
      depositing said first material over said substrate and annealing to cause said first material to react with said active regions to form said first silicide; and
   wherein said second forming step comprises:
      depositing said second material over said substrate and annealing to cause said second material to react with said gate to form said second silicide, wherein said annealing of said second silicide forming step is performed at a temperature that substantially prevents said second material from reacting with said active regions.

3. The method of claim 1, further comprising the step of:
   before said first silicide forming step, forming a shielding layer over said gate, whereby said shielding layer prevents said first material from reacting with the gate during said first silicide forming step.

4. The method of claim 3, wherein said shielding layer comprises SiN, SiON, SiC, SiCN or $SiO_2$.

5. The method of claim 3, further comprising the step of, after said first silicide forming step and before said second silicide forming step, removing said shielding layer over said gate.

6. The method of claim 5, wherein said removal step comprises etching said shielding layer with a solution comprising phosphoric acid.

7. The method of claim 1, wherein said second silicide forming step comprises fully siliciding said gate.

8. The method of claim 1, wherein said first silicide comprises a lowest resistivity phase of said first material and said second silicide comprises a lowest resistivity phase of said second material.

9. The method of claim 8, wherein said first and second materials comprise different materials.

10. A method of forming a silicided gate on a substrate having active regions, comprising the steps of:

(a) forming a shielding layer over said gate;
(b) after said forming step, depositing a first metal over said substrate;
(c) annealing to cause the first metal to react with the active regions to form a first silicide therein, whereby said shielding layer prevents said first metal from reacting with the gate during said annealing step;
(d) removing said shielding layer over said gate;
(e) depositing a second metal over said substrate in contact with said gate and said first silicide; and
(f) annealing at a temperature at or below about an annealing temperature of step (c) to cause the second metal to react with the gate to form a second silicide in said gate,
wherein said first silicide forms a baffler against said second metal forming a silicide in said active regions during step (f), and
wherein said second silicide is formed to a thickness greater than said first silicide.

11. The method of claim 10, wherein said first silicide comprises a lowest resistivity phase of said first metal and said second silicide comprises a lowest resistivity phase of said second metal.

12. The method of claim 11, wherein said first and second metals comprise different materials.

13. The method of claim 12, wherein said first silicide comprises $CoSi_2$ and said second silicide comprises NiSi.

14. The method of claim 10, wherein said shielding layer comprises SiN, SiON, SiC, SiCN or $SiO_2$.

15. The method of claim 10, wherein said gate is fully silicided.

16. A method of forming a silicided gate on a substrate having active regions, comprising the steps of:
forming a first silicide in the active regions from a first material, said forming step comprising depositing said first material over said substrate and annealing to cause said first material to react with said active regions to form said first silicide; and
forming a second silicide in the gate from a second material, said second silicide forming step comprising depositing said second material over said substrate and annealing to cause said second material to react with said gate to form said second silicide, wherein said annealing of said second silicide forming step is performed at a temperature that substantially prevents said second material from reacting with said active regions,
wherein said first silicide forms a barrier against said second material forming a silicide in said active regions during said second silicide forming step,
wherein said second silicide is thicker than said first silicide,
wherein said first material comprises cobalt and said second material comprises nickel.

17. The method of claim 16, wherein said temperature of said second silicide forming step is less than or equal to a temperature of said annealing of said first silicide forming step.

18. The method of claim 16, wherein said annealing of said first silicide forming step comprises an annealing at a temperature of at least about 650° C., wherein said first silicide comprises $CoSi_2$.

19. The method of claim 18, wherein said annealing of said second silicide forming step comprises an annealing at a temperature between about 250-700° C., wherein said second silicide comprises NiSi.

20. The method of claim 19, wherein said annealing of said second silicide forming step comprises annealing at a temperature between about 200-500° C.

21. A method of forming a silicided gate on a substrate having active regions, comprising the steps of:
forming a first silicide in the active regions from a first material; and
forming a second silicide in the gate from a second material, wherein said first silicide forms a barrier against said second material forming a silicide in said active regions during said second silicide forming step,
wherein said second silicide is thicker than said first silicide,
wherein said second silicide forming step comprises fully siliciding said gate.

22. A method of forming a silicided gate on a substrate having active regions, comprising the step of:
depositing a first material over said substrate;
performing a first annealing of said substrate to cause the first material to react with the active regions to form a first silicide therein, wherein said gate is protected from silicidation during said annealing step;
depositing a second material over said substrate in contact with said gate and said first silicide; and
performing a second annealing of said substrate under processing conditions sufficient to cause the second material to react with the gate to form a second silicide in said gate but insufficient to cause further silicidation in said active area,
wherein said second silicide is formed to a thickness greater than said first silicide.

23. The method of claim 22, wherein a processing temperature of said second annealing is less than or equal to a processing temperature of said first annealing.

24. The method of claim 23, wherein said first material comprises cobalt and said second material comprises nickel.

25. The method of claim 24,
wherein said first annealing is at a temperature of at least about 650° C., wherein said first silicide comprises $CoSi_2$,
wherein said second annealing is at a temperature between about 250-700° C., wherein said second silicide comprises NiSi.

26. The method of claim 25, wherein said second annealing is at a temperature between about 200-500° C.

27. The method of claim 22, wherein the gate is fully silicided.

28. The method of claim 22, wherein said first and second materials comprise different materials.

29. The method of claim 22, wherein at least one processing condition selected from the group consisting of processing temperature and processing time associated with the first annealing are different than for the second annealing.

30. The method of claim 22, wherein a processing temperature of said second annealing is less than a processing temperature of said first annealing.

* * * * *

UNITED STATES PATENT AND TRADEMARK OFFICE
CERTIFICATE OF CORRECTION

PATENT NO. : 7,396,767 B2
APPLICATION NO. : 10/892915
DATED : July 8, 2008
INVENTOR(S) : Chii-Ming Wu et al.

It is certified that error appears in the above-identified patent and that said Letters Patent is hereby corrected as shown below:

Column 7, line 14, delete "baffler" and insert -- barrier -- therefor.

Signed and Sealed this

Twenty-sixth Day of August, 2008

JON W. DUDAS
*Director of the United States Patent and Trademark Office*